(12) United States Patent
Kim et al.

(10) Patent No.: US 9,202,767 B2
(45) Date of Patent: Dec. 1, 2015

(54) SEMICONDUCTOR DEVICE AND METHOD OF MANUFACTURING THE SAME

(75) Inventors: Ji Hwang Kim, Bucheon-si (KR); Kwang-Chul Choi, Suwon-si (KR); Sangwon Kim, Seoul (KR); Tae Hong Min, Gumi-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 85 days.

(21) Appl. No.: 13/422,745

(22) Filed: Mar. 16, 2012

(65) Prior Publication Data

US 2012/0228780 A1    Sep. 13, 2012

(30) Foreign Application Priority Data

Mar. 8, 2011 (KR) .................. 10-2011-0024430

(51) Int. Cl.
*H01L 23/522* (2006.01)
*H01L 23/36* (2006.01)
(Continued)

(52) U.S. Cl.
CPC .......... *H01L 23/36* (2013.01); *H01L 21/76898* (2013.01); *H01L 23/481* (2013.01); *H01L 25/0657* (2013.01); *H01L 21/563* (2013.01); *H01L 23/147* (2013.01); *H01L 23/3114* (2013.01); *H01L 23/3135* (2013.01); *H01L 23/3192* (2013.01); *H01L 23/48* (2013.01); *H01L 23/49816* (2013.01); *H01L 23/525* (2013.01); *H01L 23/552* (2013.01); *H01L 24/13* (2013.01); *H01L 24/16* (2013.01); *H01L 24/32* (2013.01); *H01L 24/73* (2013.01); *H01L 24/80* (2013.01); *H01L 24/81* (2013.01); *H01L 2224/02379* (2013.01); *H01L 2224/0401* (2013.01); *H01L 2224/0519* (2013.01); *H01L 2224/0557* (2013.01); *H01L 2224/05548* (2013.01); *H01L 2224/05556* (2013.01); *H01L 2224/131* (2013.01); *H01L 2224/13021* (2013.01); *H01L 2224/13022* (2013.01);
(Continued)

(58) Field of Classification Search
CPC ....................................................... H01L 23/522
USPC .................................................. 257/751, 774
See application file for complete search history.

(56) References Cited

U.S. PATENT DOCUMENTS 6,809,421 B1   10/2004   Hayasaka et al.
7,691,748 B2    4/2010   Han
(Continued)

FOREIGN PATENT DOCUMENTS

JP    2008-091857    4/2008
JP    2009-010178    1/2009
(Continued)

*Primary Examiner* — Colleen Matthews
*Assistant Examiner* — William Harriston
(74) *Attorney, Agent, or Firm* — F. Chau & Associates, LLP

(57) ABSTRACT

Provided are a semiconductor device including a through via plug and a method of manufacturing the same. In the semiconductor device, since a redistributed interconnection pattern is disposed on a protection film of a convex-concave structure having a protrusion and a recessed portion, the semiconductor device may have improved reliability while preventing a leakage current. In the method of manufacturing the semiconductor device, since an end surface of through via structure is exposed by removing a protection film and an insulating film liner using a selective etching process, damage to the through via structure is minimized, thereby preventing copper contamination in a substrate.

15 Claims, 21 Drawing Sheets

(51) Int. Cl.
  H01L 25/065 (2006.01)
  H01L 21/768 (2006.01)
  H01L 23/48 (2006.01)
  H01L 23/14 (2006.01)
  H01L 23/00 (2006.01)
  H01L 21/56 (2006.01)
  H01L 23/31 (2006.01)
  H01L 23/498 (2006.01)
  H01L 23/525 (2006.01)
  H01L 23/552 (2006.01)

(52) U.S. Cl.
  CPC ........... *H01L 2224/16145* (2013.01); *H01L 2224/16225* (2013.01); *H01L 2224/16227* (2013.01); *H01L 2224/32145* (2013.01); *H01L 2224/32225* (2013.01); *H01L 2224/73204* (2013.01); *H01L 2224/73253* (2013.01); *H01L 2225/06513* (2013.01); *H01L 2225/06517* (2013.01); *H01L 2225/06544* (2013.01); *H01L 2225/06568* (2013.01); *H01L 2225/06589* (2013.01); *H01L 2924/00014* (2013.01); *H01L 2924/15311* (2013.01); *H01L 2924/18161* (2013.01)

(56) References Cited

U.S. PATENT DOCUMENTS

| | | |
|---|---|---|
| 2005/0136634 A1* | 6/2005 | Savastiouk et al. ........... 438/597 |
| 2005/0186790 A1* | 8/2005 | Kirby et al. .................... 438/667 |
| 2008/0079121 A1 | 4/2008 | Han |
| 2009/0004859 A1 | 1/2009 | Kimura et al. |
| 2009/0108411 A1* | 4/2009 | Shiraishi et al. .............. 257/621 |
| 2009/0321947 A1* | 12/2009 | Pratt ............................ 257/777 |
| 2010/0148370 A1 | 6/2010 | Han |

FOREIGN PATENT DOCUMENTS

| | | |
|---|---|---|
| KR | 100800161 | 1/2008 |
| KR | 1020090114492 | 11/2009 |

* cited by examiner

SEMICONDUCTOR DEVICE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2011-0024430, filed on Mar. 18, 2011, the entire contents of which are hereby incorporated by reference.

BACKGROUND

The embodiments of the present inventive concept herein relate to semiconductor devices and methods of manufacturing the semiconductor devices.

Advances in packaging technologies for integrated circuits made possible for miniaturization of large scale electronic systems.

The term "stacking" used in a semiconductor device field may mean vertically stacking at least two chips or packages. By stacking, memory chips may realize twofold or more in memory capacity. While memory capacity may increase by higher mounting density and efficient use of mounting areas, signal transmission between stacked chips may degrade.

SUMMARY

An embodiment of the inventive concept provides a semiconductor device. The semiconductor device may include a substrate including a first surface and a second surface, a protection film having a protrusion and a recessed portion, the protection film being disposed on the first surface, and a through via structure penetrating the substrate and the protection film and including an end surface coplanar with or higher than the recessed portion of the protection film.

An embodiment of the inventive concept provides a method of manufacturing a semiconductor device. The method may include forming a through via hole through a substrate having a first surface and a second surface, forming an insulating film liner and a through via structure in the through via hole, exposing a top surface and a part of side surfaces of the insulating film liner, conformally forming a protection film and a mask film on the first surface of the substrate and the exposed top surface of the insulating film liner, performing a first planarization process on the mask film and the protection film overlapping the through via structure to form a mask pattern adjacent to a sidewall of the through via structure, and performing a selective etching process using the mask pattern as an etch mask to form a protrusion and a recessed portion in the protection film, to remove part of the insulating film liner, and to expose an upper portion of the through via structure.

BRIEF DESCRIPTION OF THE FIGURES

The embodiments of the inventive concept will be apparent from the more particular description as illustrated in the accompanying drawings.

FIGS. 5 through 8A are enlarged cross sectional views illustrating a process of manufacturing the semiconductor device of FIG. 2.

DETAILED DESCRIPTION OF THE EMBODIMENTS

Figure 1:
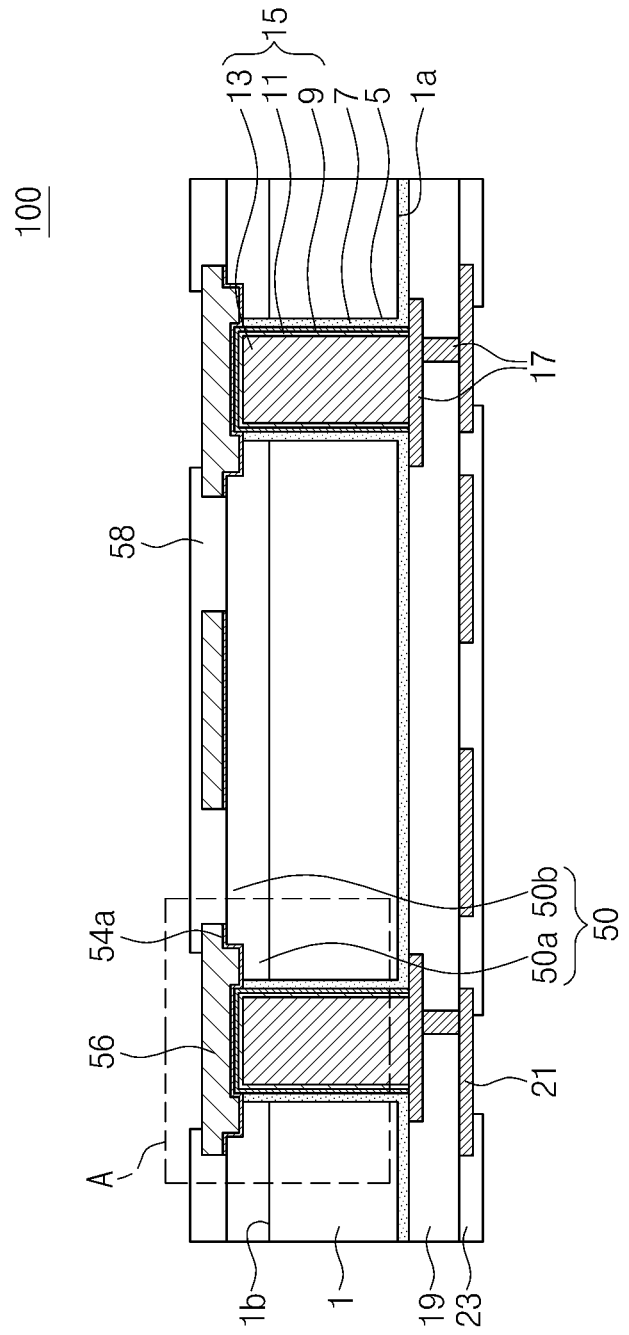
FIG. 1 is a cross sectional view of a semiconductor device in accordance with an embodiment of the inventive concept.

The embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers may refer to like or similar elements throughout the specification and the drawings.

In the drawings, the thickness of layers and regions may be exaggerated for clarity. It will also be understood that when an element such as a layer, region or substrate is referred to as being "on" or "onto" another element, it may lie directly on the other element or intervening elements or layers may also be present.

Figure 2:
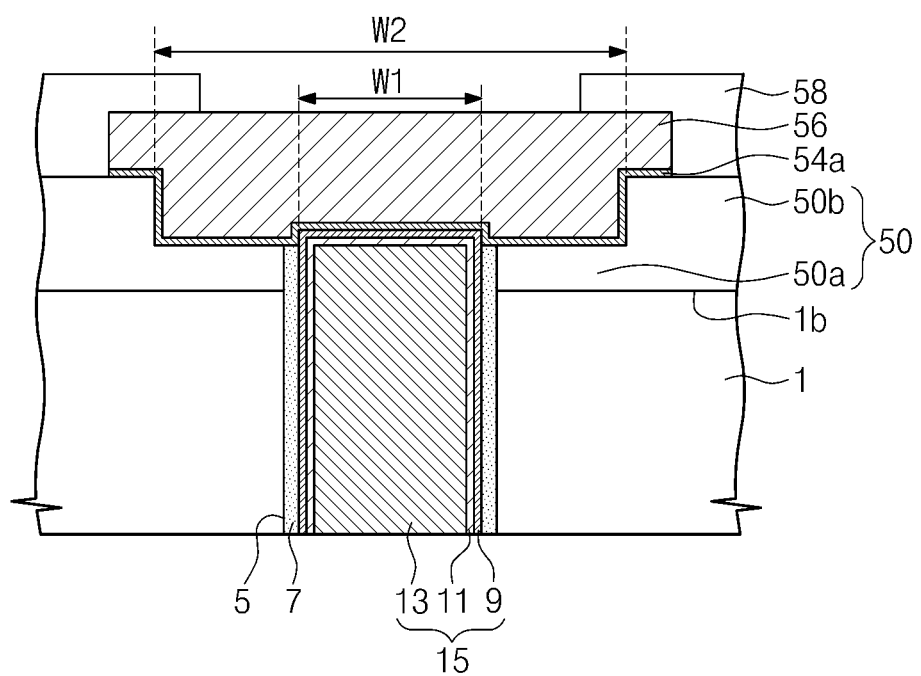
FIG. 2 is an enlarged cross sectional view of part "A" of FIG. 1.

FIG. 1 is a cross sectional view of a semiconductor device in accordance with an embodiment of the inventive concept. FIG. 2 is an enlarged cross sectional view of part "A" of FIG. 1.

Referring to FIGS. 1 and 2, a semiconductor device 100 in accordance with an embodiment includes a substrate 1 including a bottom surface 1a and a top surface 1b facing each other. The substrate 1 may be, for example, a semiconductor substrate. According to an embodiment, the bottom surface 1a of the substrate 1 may include device isolation films to define an active region. Transistors may be disposed in the active region defined by the device isolation films. A plurality of interconnection lines and an interlayer insulating film 19 are disposed on the bottom surface 1a of the substrate 1. A pad 21 and a first protection film 23 exposing a part of the pad 21 may be disposed on the interlayer insulating film 19.

A second protection film 50 is disposed on the top surface 1b of the substrate 1. The second protection film 50 has a surface of a convex-concave structure including a recessed portion 50a and a protrusion 50b. The second protection film 50 may include, for example, a silicon oxide film. A through via structure 15 may penetrate the substrate 1 and the second protection film 50. The through via structure 15 may penetrate a center of the recessed portion 50a of the second protection film 50. A width W1 of the through via structure 15 is smaller than a width W2 of the recessed portion 50a. The through via structure 15 includes a through via plug 13, a through via seed film 11, and a diffusion prevention film 9. The through via seed film 11 is disposed between the through via plug 13 and the substrate 1. The diffusion prevention film 9 is disposed between the through via seed film 11 and the substrate 1. An end surface (for example, a top surface of FIG. 2) of the through via structure 15 adjacent to and parallel to the top surface 1b of the substrate 1 may be with the same as or higher in height than a surface of the recessed portion 50a of the second protection film 50. The protrusion 50b of the second protection film 50 is located to be higher in height than the end surface of the through via structure 15. According to an embodiment, the diffusion prevention film 9 is exposed at the end surface of the through via structure 15 as illustrated in FIG. 2. According to an embodiment, the through via seed film 11 or the through via plug 13 may be exposed at the end surface of the through via structure 15.

An insulating film liner 7 is disposed between the through via structure 15 and the substrate 1 and between the through via structure 15 and the second protection film 50. The insulating film liner 7 may extend to be disposed between the bottom surface 1a of the substrate 1 and the interlayer insulating film 19. The insulating film liner 7 may include the same material (e.g., a silicon oxide film) as the second protection film 50. An angle between an end surface of the insulating film liner 7 adjacent to and parallel to the top surface 1b and a side of the through via structure 15 may be 90 degree or less.

A redistributed interconnection adhesive film pattern 54a and a redistributed interconnection pattern 56 are disposed on the recessed portion 50a of the second protection film 50 and the adjacent protrusion 50b of the second protection film 50. The redistributed interconnection adhesive film pattern 54a includes a double film of a diffusion prevention film for forming a redistributed interconnection and a redistributed interconnection seed film. One side of the redistributed interconnection pattern 56 and the second protection film 50 are covered with a passivation film 58. The passivation film 58 may include an organic insulating film, such as polyimide.

Since in the semiconductor device 100, the redistributed interconnection pattern 56 is disposed on the second protection film 50 having a concave-convex structure, a contact area between the second protection film 50 and the redistributed interconnection pattern 56 is wide and thereby the redistributed interconnection pattern 56 may be prevented from being detached from the second protection film 50.

Figure 3:
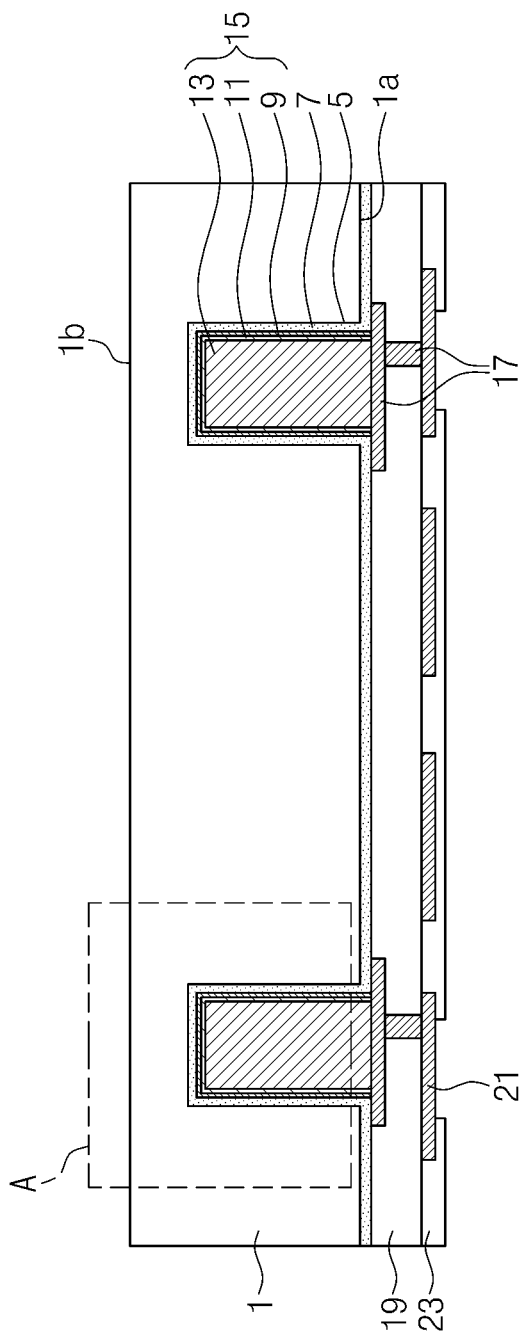
FIG. 3 is a cross sectional view illustrating a process of manufacturing the semiconductor device of FIG. 1.
Figure 4:
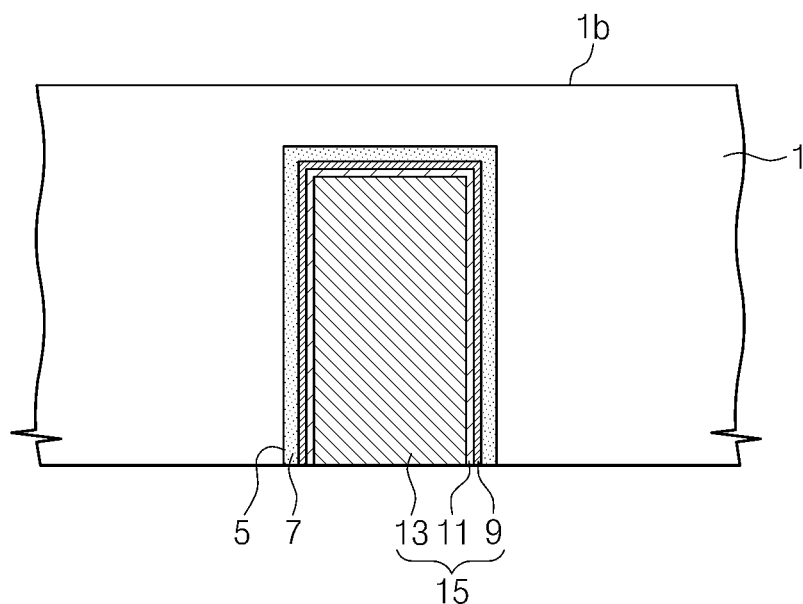
FIG. 4 is an enlarged cross sectional view of part "A" of FIG. 3.

FIG. 3 is a cross sectional view illustrating a process of manufacturing the semiconductor device of FIG. 1. FIG. 4 is an enlarged cross sectional view of part "A" of FIG. 3.

Referring to FIGS. 3 and 4, a through via hole 5 is formed in a substrate 1 including a bottom surface 1a and a top surface 1b facing each other. The through via hole 5 may be formed in the substrate 1 from the bottom surface 1a and may be formed to be spaced apart from the top surface 1b. An insulating film liner 7 is conformally formed on an entire surface of the substrate 1 where the through via hole 5 is formed. The insulating film liner 7 may be formed of a silicon oxide film. A diffusion prevention film 9 and the through via seed film 11 are conformally formed on the insulating film liner 7. The diffusion prevention film 9 may be formed of at least one film selected from a group including titanium, a titanium nitride film, tantalum, and a tantalum nitride film. The through via seed film 11 may be formed of, for example, copper. A copper film is formed on the seed film 11 using a plating process and fills the through via hole 5. A planarization process is performed on the copper film and forms a through via plug 13 in the through via hole 5. The bottom surface 1a of the substrate 1 or the insulating film liner 7 may be exposed by the planarization process. According to an embodiment, a device isolation film is formed at the bottom surface 1a of the substrate 1 and defines an active region. A plurality of transistors are formed in the defined active region. A plurality of interlayer insulating films 19 and interconnections 17 are formed on the bottom surface 1a of the substrate 1. A pad 21 and a protection film 23 exposing a part of the pad 21 are formed on an uppermost interlayer insulating film 19. The diffusion prevention film 9, the through via seed film 11, and the through via plug 13 may constitute a through via structure 15.

A subsequent process is described with reference to FIGS. 5 through 8a and 8b. FIGS. 5 through 8A are enlarged cross sectional views illustrating a process of manufacturing the semiconductor device of FIG. 2. FIG. 8B is an enlarged view of part "B" of FIG. 8A.

Figure 5:
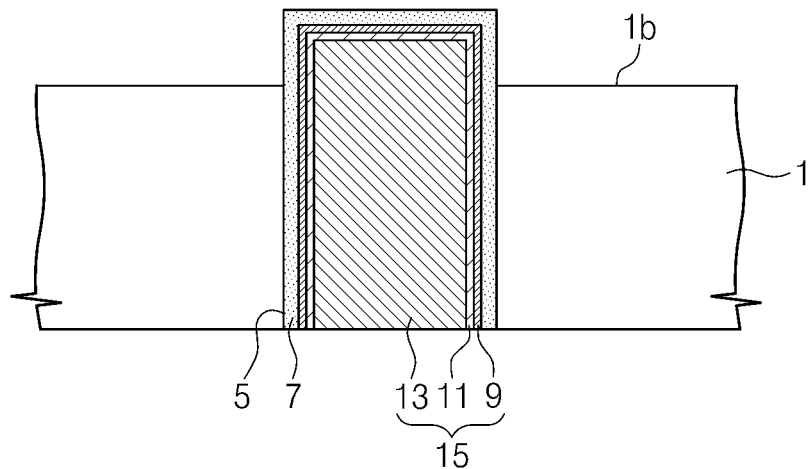

Referring to FIG. 5, a part of the substrate 1 adjacent to the top surface 1b is removed to expose a bottom surface of the insulating film liner 7. An etch-back process selectively removing the substrate 1 is performed. The etch-back process may continuously be performed until an end surface of the through via plug 13 parallel to the top surface 1b of the substrate 1 becomes higher than the top surface 1b of the substrate 1. As shown in FIG. 5, the top surface 1b is formed to be lower than an end surface of the through via plug 13.

Figure 6:
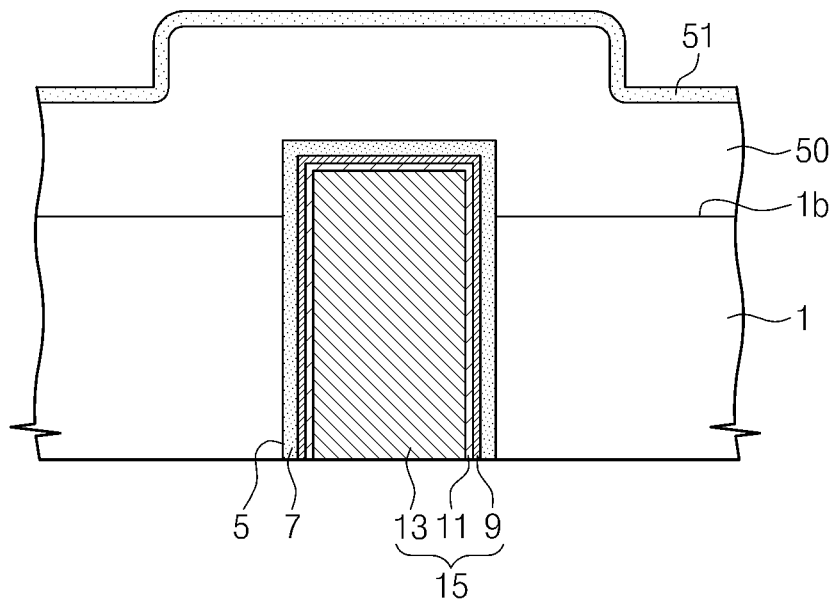

Referring to FIG. 6, a second protection film 50 and a mask film 51 are sequentially and conformally formed on the top surface 1b of the substrate 1 while an end surface of the through via structure 15 is higher than the top surface 1b of the substrate 1. The mask film 51 is formed of material having an etching selectivity with respect to the second protection film 50. For example, the second protection film 50 may include a silicon oxide film, and the mask film 5 may include a silicon nitride film.

Figure 7:
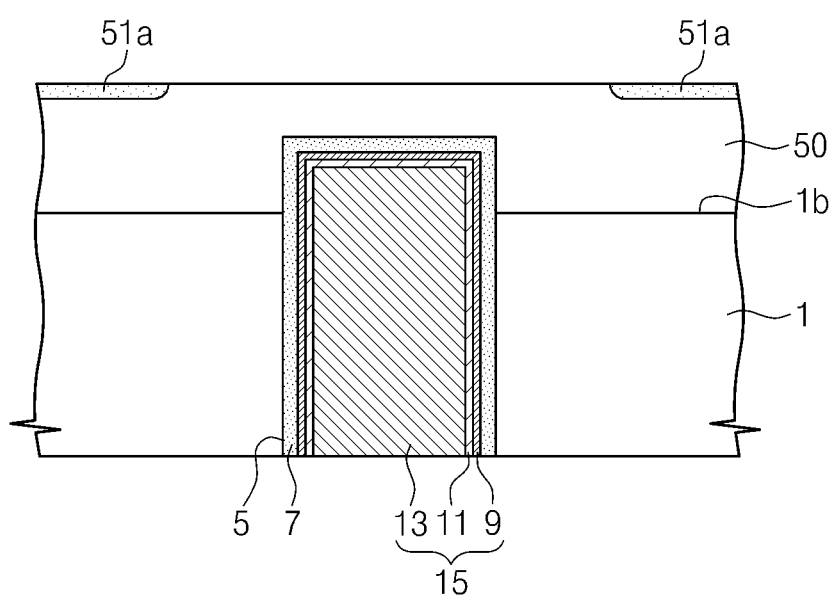

Referring to FIG. 7, a planarization process is performed to remove the mask film 51 overlapping the through via structure 15. An upper portion of the second protection film 50 may be removed to be planarized. The planarization process may be, for example, a chemical mechanical polishing (CMP) process. The planarization process may be stopped by a time control method. The mask film 51 may be used as a planarization stop film during the planarization process. Even though the mask film 51 is used as a planarization stop film, a protrusion of the mask film 51, which has a protrusive surface profile formed by the through via structure 15, may be removed during the planarization process. As illustrated in FIG. 7, a mask pattern 51a is formed on the second protection film 50 adjacent to a side of the through via structure 15.

Figure 8A:
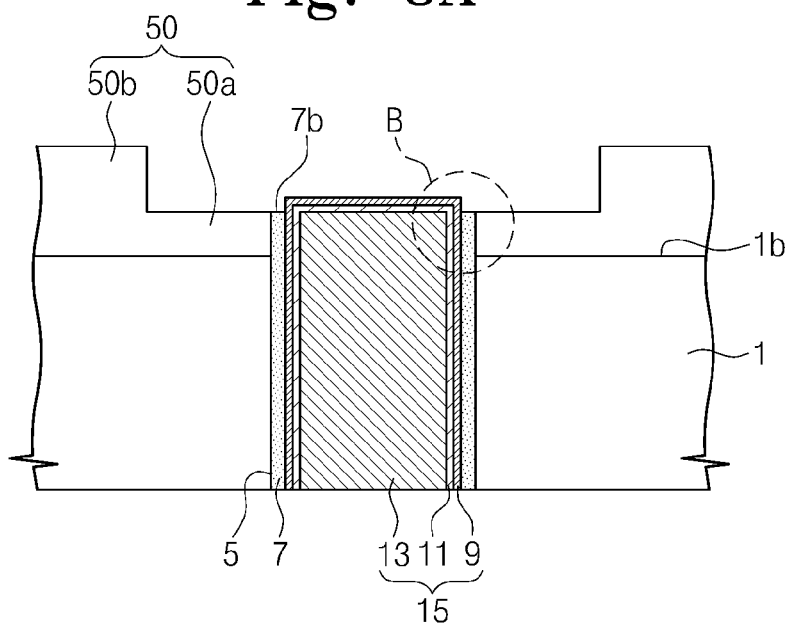
Figure 8B:
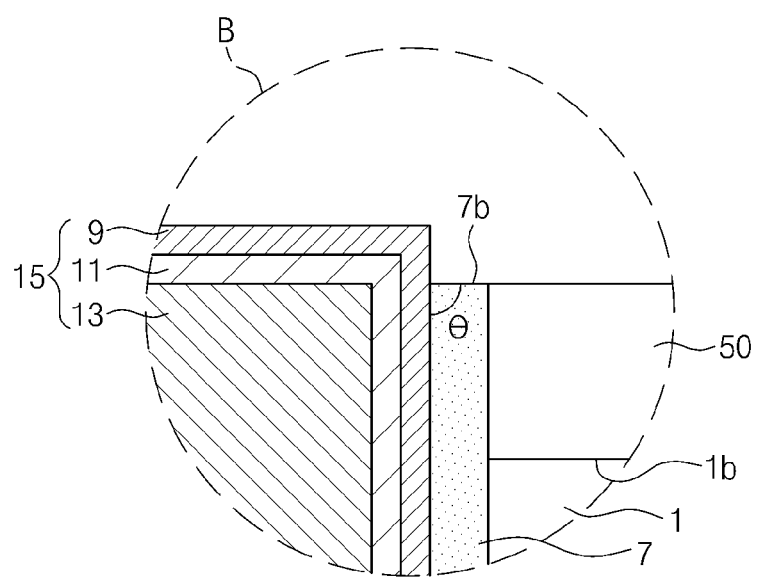
FIG. 8B is an enlarged view of part "B" of FIG. 8A.

Referring to FIGS. 8A and 8B, an anisotropic etching process is performed using the mask pattern 51a as an etching mask to remove part of the second protection film 50 and part of the insulating film liner 7 and thereby an end surface of the through via structure 15 is exposed. In the anisotropic etching process, a process condition may be controlled so that an etching selectivity of the mask pattern 51a and the second protection film 50 becomes low. As a result, the mask pattern 51a may be all removed during the anisotropic etching process and a recessed portion 50a and a protrusion 50b may be formed in the second protection film 50. In the case that the insulating film liner 7 is formed of the same material as the second protection film 50, part of the insulating film liner 7 is also removed at the same etching speed as the second protection film 50 and thereby an end surface of the insulating film liner 7 may be coplanar with a surface of the recessed portion 50a. An end surface of the through via structure 15 parallel to the top surface 1b of the substrate 1 may be exposed. Furthermore, a part of sidewall of the through via structure 15 may be exposed. The diffusion prevention film 9 may be exposed at the end surface of the through via structure 15. The anisotropic etching process may be stopped by detecting a material constituting the diffusion prevention film 9. For example, the diffusion prevention film 9 may be used for an end point detection of the anisotropic etching process. The through via plug 13 may be exposed at the end surface of the through via structure 15 by the anisotropic etching process. Since the end surface of the through via structure 15 is exposed by not a CMP process but an anisotropic etching process, damage to the through via structure 15 may be minimized and thereby copper contamination in the substrate 1 may be minimized.

Figure 9A:
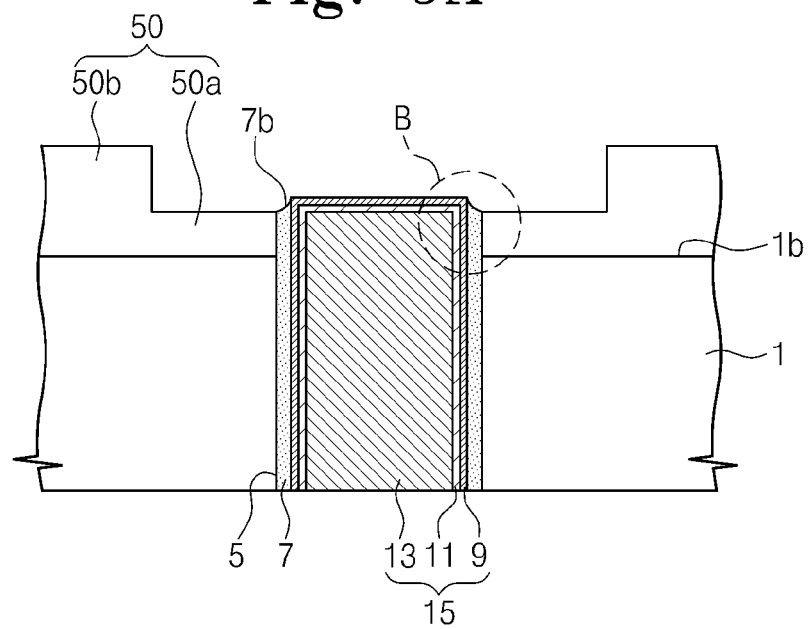
FIG. 9A is a process cross sectional view in accordance with an embodiment of the inventive concept.
Figure 9B:
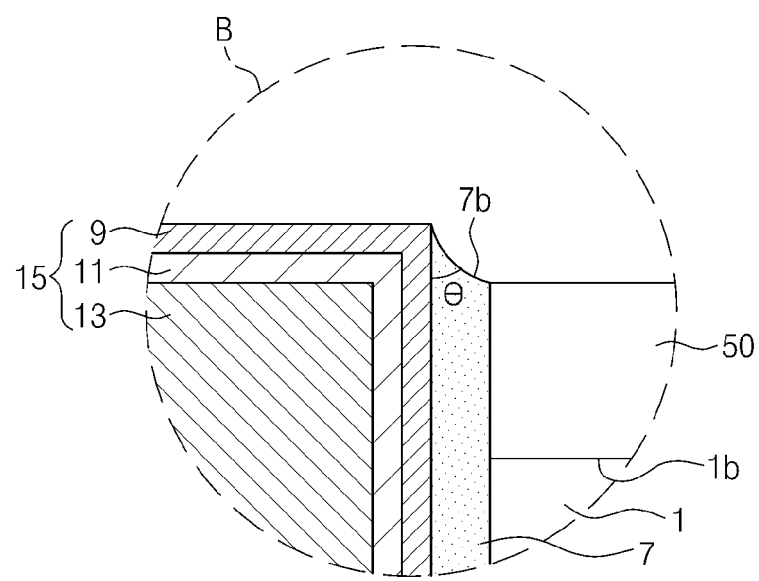
FIG. 9B is an enlarged view of part "B" of FIG. 9A.

FIG. 9A is a process cross sectional view in accordance with an embodiment of the inventive concept. FIG. 9B is an enlarged view of part "B" of FIG. 9A.

Referring to FIGS. 9A and 9B, an end surface 7b of the insulating film liner 7 is inclined toward a side of the through via structure 15 by an anisotropic etching process and the insulating film liner 7 covers the side of the through via structure 15.

As in the embodiments described in connection with FIGS. 8B and 9B, the end surface 7b of the insulating film liner 7 may be coplanar with a surface of the recessed portion 50a or the end surface 7b of the insulating film liner 7 is formed to be inclined toward a side of the through via structure 15. As illustrated in FIGS. 8B and 9B, an angle between the insulating film liner 7 and a side of the through via structure 15 becomes 90 degree or less. Therefore, a leakage current from the through via structure 15 may be prevented, and occurrence of a notch between the through via structure 15 and the insulating film liner 7 may be prevented, thereby improving reliability of the semiconductor device. Also, in a subsequent process, a step coverage characteristic of a redistributed interconnection adhesive film 54 for forming a redistributed interconnection pattern 56 may be improved.

Figure 10:
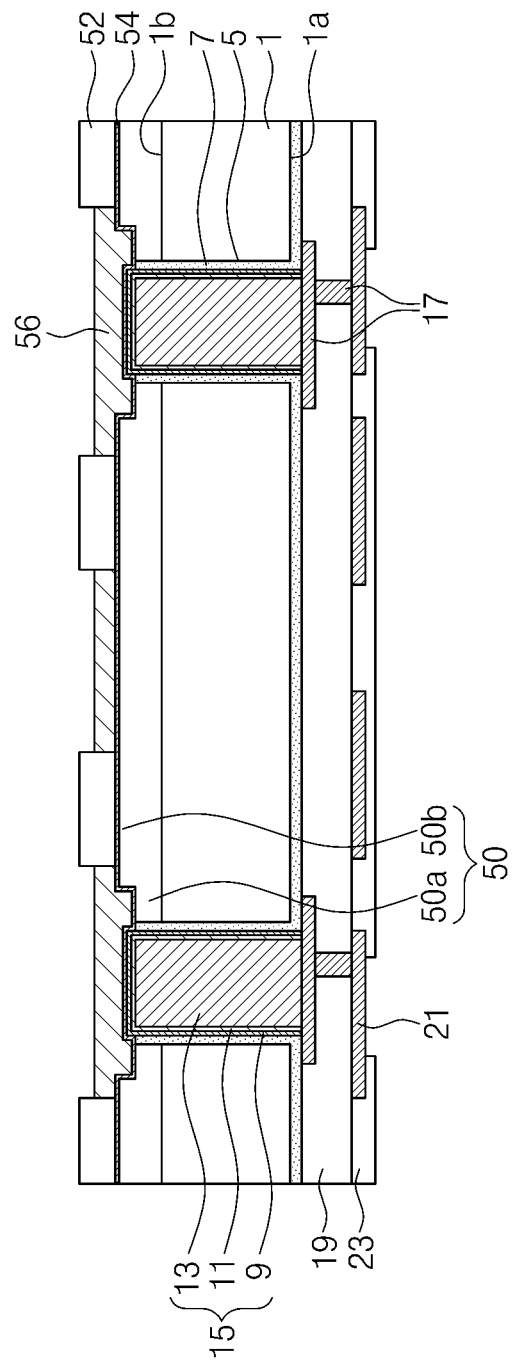
FIGS. 10 and 11 are cross sectional views illustrating a process of manufacturing the semiconductor device of FIG. 1.
Figure 11:
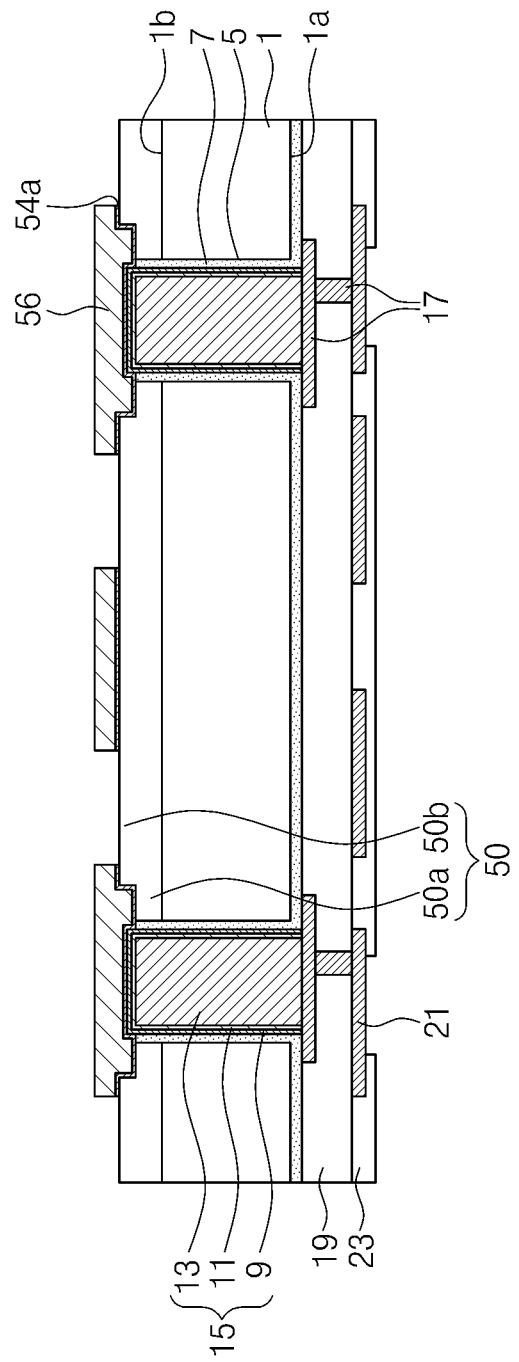

The subsequent process is now described with reference to FIGS. 10 and 11. FIGS. 10 and 11 are cross sectional views illustrating a process of manufacturing the semiconductor device of FIG. 1.

Referring to FIG. 10, the redistributed interconnection adhesive film 54 is conformally formed on the second protection film 50 while the end surface of the through via structure 15 is exposed. The redistributed interconnection adhesive film 54 includes a double film of a diffusion prevention film for forming a redistributed interconnection and a redistributed interconnection seed film. The diffusion prevention film for forming a redistributed interconnection included in the redistributed interconnection adhesive film 54 can prevent copper from diffusing. A photoresist pattern 52 limiting the redistributed interconnection pattern is formed on the redistributed interconnection adhesive film 54. The photoresist pattern 52 may be formed through a photolithography process. A plating process is performed to form the redistributed interconnection pattern 56 on the redistributed interconnection adhesive film 54 exposed by the photoresist pattern 52.

Referring to FIG. 11, the photoresist pattern 52 is removed by an ashing process. The redistributed interconnection adhesive film 54 covered with the photoresist pattern 52 is removed to expose a surface of the second protection film 50 and forms a redistributed interconnection adhesive film pattern 54a under the redistributed interconnection pattern 56.

Subsequently, as shown in FIG. 1, a passivation film 58 exposing part of the redistributed interconnection pattern 56 and covering the second protection film 50 is formed to complete the semiconductor device 100 of FIG. 1.

Figure 12:
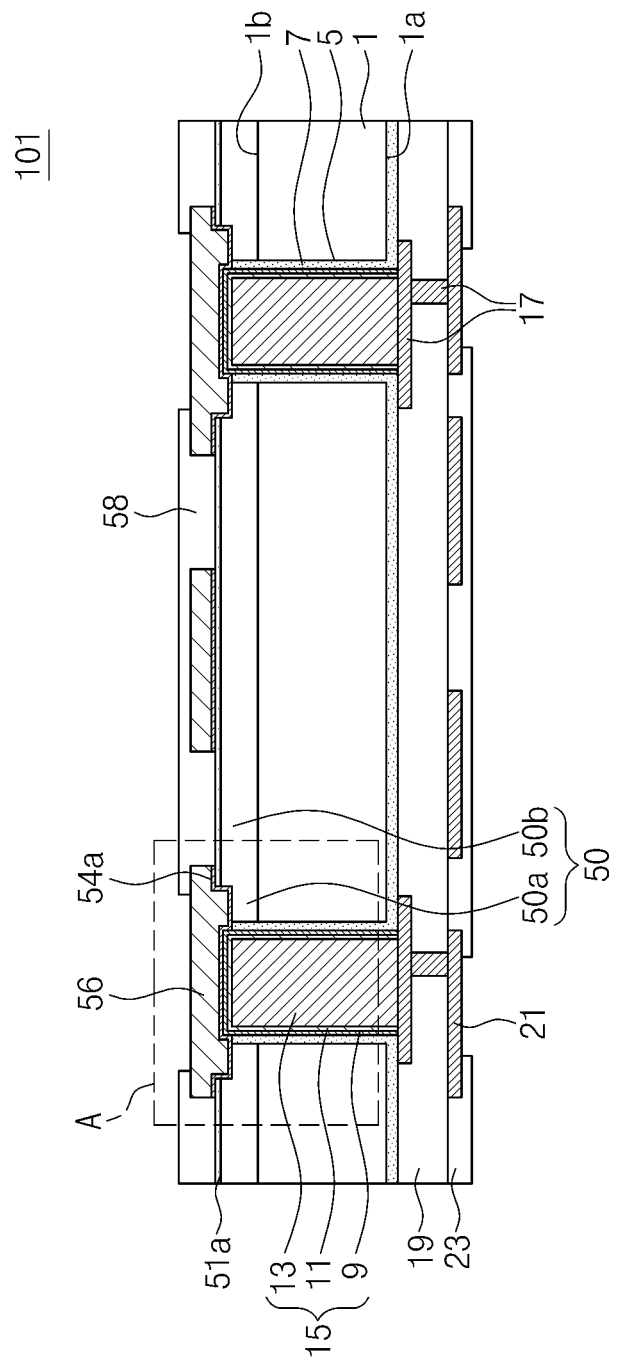
FIG. 12 is a cross sectional view of a semiconductor device in accordance with an embodiment of the inventive concept.
Figure 13:
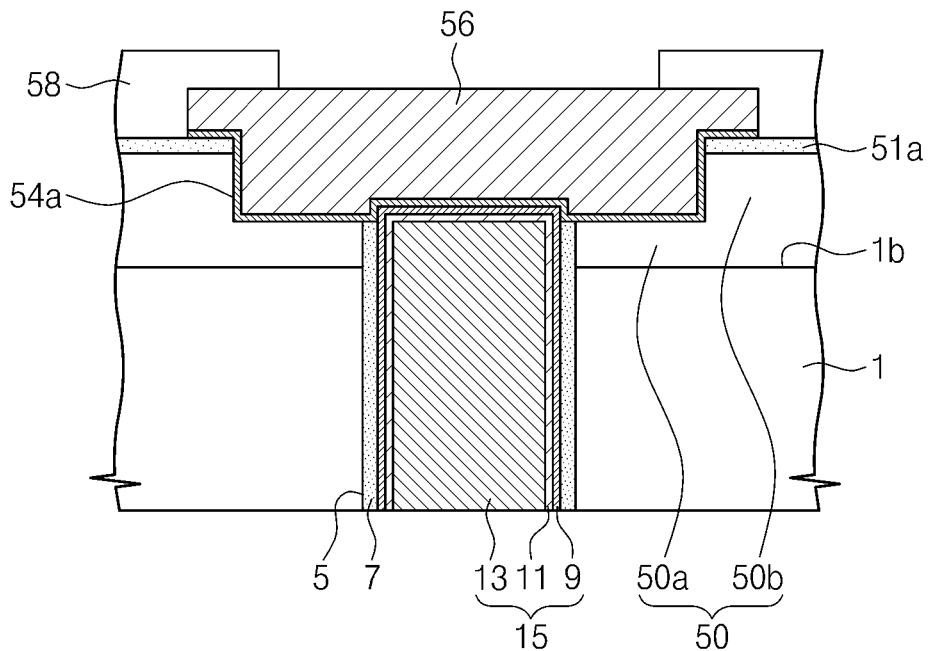
FIG. 13 is an enlarged cross sectional view of part "A" of FIG. 12.

FIG. 12 is a cross sectional view of a semiconductor device in accordance with an embodiment of the inventive concept. FIG. 13 is an enlarged cross sectional view of part "A" of FIG. 12.

Referring to FIGS. 12 and 13, in a semiconductor device 101 in accordance with an second embodiment, a mask pattern 51a is interposed between the protrusion 50b of the second protection film 50 and a passivation film 58. A structure except those described above may be identical to or similar to the embodiment described in connection with FIG. 1.

Figure 14:
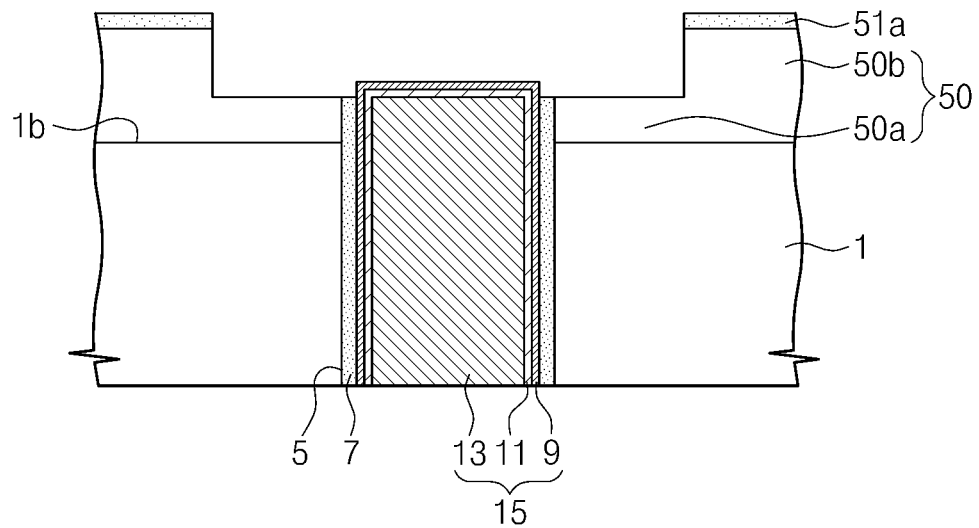
FIG. 14 is an enlarged cross sectional view illustrating a process of manufacturing the semiconductor device of FIG. 13.

A process of manufacturing the semiconductor device 101 in accordance with an embodiment is now described with reference to FIG. 14. FIG. 14 is an enlarged cross sectional view illustrating a process of manufacturing the semiconductor device of FIG. 13.

Referring to FIG. 14, after forming the mask pattern 51a by performing a planarization process as illustrated in FIG. 7, an anisotropic etching process is performed using the mask pattern 51a as an etching mask to remove part of the second protection film 50 and part of the insulating film liner 7 and thereby an end surface of the through via structure 15 is exposed. According to an embodiment, in the anisotropic etching process, a process condition may be controlled so that an etching selectivity of the mask pattern 51a and the second protection film 50 becomes very high. As a result, the mask pattern 51a remains after the anisotropic etching process. Subsequently, a process identical to or similar to the process described in connection with FIGS. 8 to 11 is performed to manufacture the semiconductor device 101 of FIGS. 12 and 13.

Figure 15:
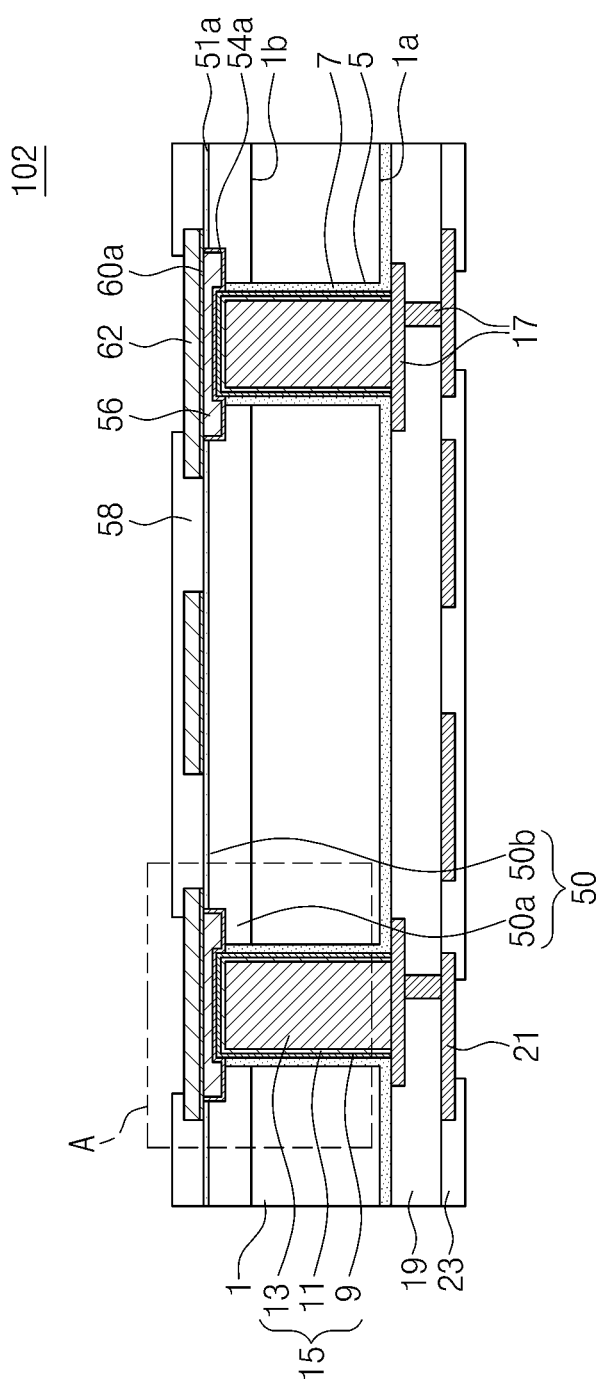
FIG. 15 is a cross sectional view of a semiconductor device in accordance with an embodiment of the inventive concept.
Figure 16:
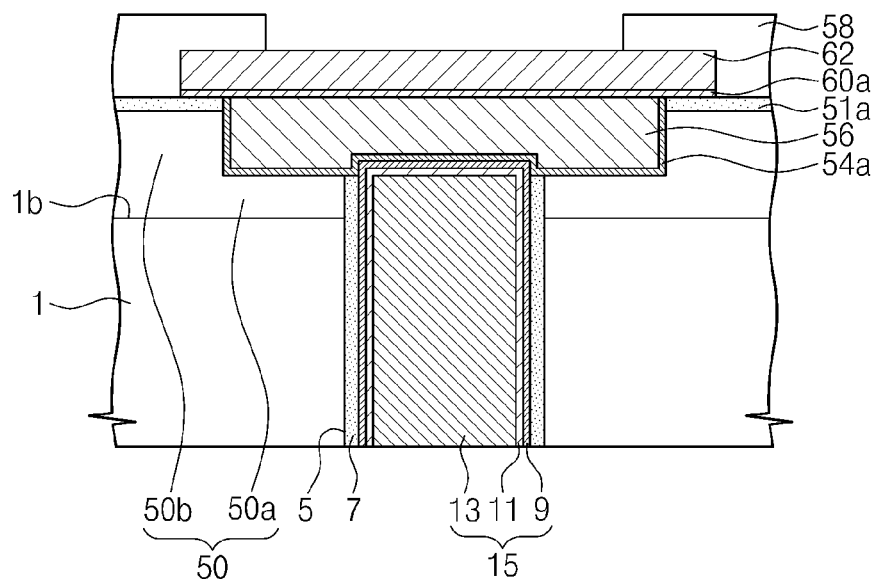
FIG. 16 is an enlarged cross sectional view of part "A" of FIG. 15.

FIG. 15 is a cross sectional view of a semiconductor device in accordance with an embodiment of the inventive concept. FIG. 16 is an enlarged cross sectional view of part "A" of FIG. 15.

Referring to FIGS. 15 and 16, in a semiconductor device 102 in accordance with an embodiment, the redistributed interconnection adhesive film pattern 54a and the redistributed interconnection pattern 56 are disposed on the recessed portion 50a of the second protection film 50. The mask patterns 51a are disposed on the protrusion 50b of the second protection film 50. Top surfaces of the redistributed interconnection adhesive film pattern 54a and the redistributed interconnection pattern 56 are coplanar with a top surface of the mask pattern 51a. According to an embodiment, a pad 21 disposed on the bottom surface 1a of the substrate 1 may be called a first pad 21, and the redistributed interconnection pattern 56 may be called a second pad 56. An auxiliary redistributed interconnection adhesive film pattern 60a and an auxiliary redistributed interconnection pattern 62 are disposed on the mask pattern 51a. A structure except those described above may be identical to or similar to the embodiment described in connection with FIGS. 12 to 14.

Figure 17:
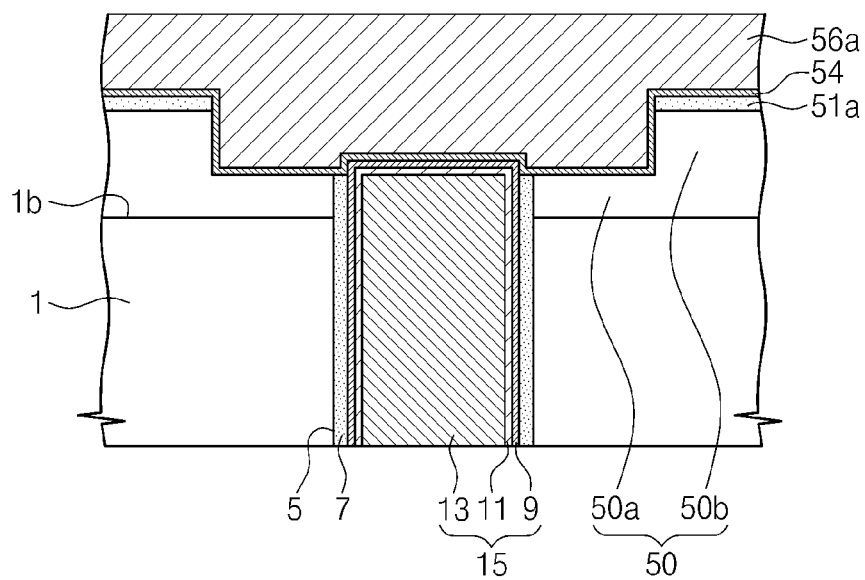
FIGS. 17 and 18 are enlarged cross sectional views illustrating a process of manufacturing the semiconductor device of FIG. 16.
Figure 18:
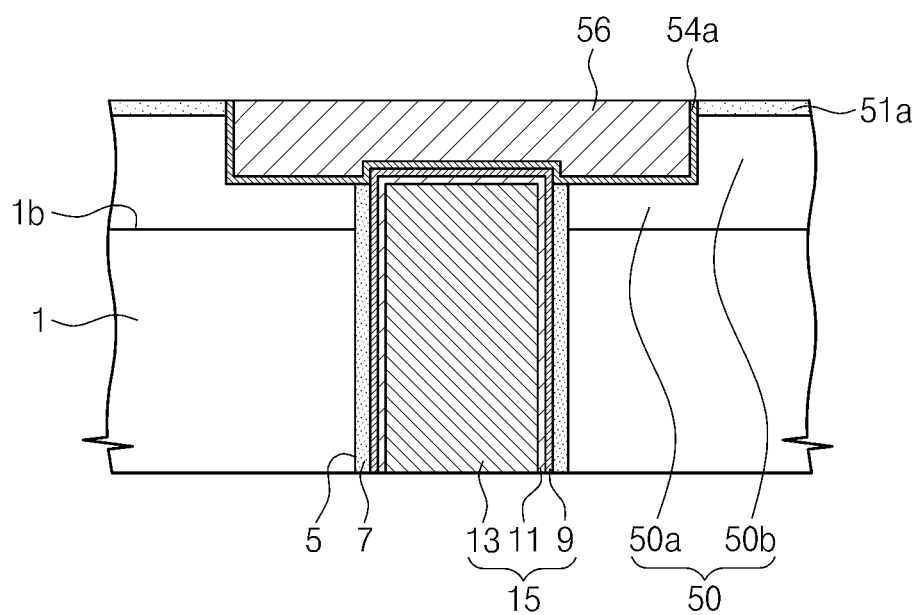

FIGS. 17 and 18 are enlarged cross sectional views illustrating a process of manufacturing the semiconductor device of FIG. 16.

Referring to FIG. 17, as illustrated in FIG. 14, an anisotropic etching process is performed using the mask pattern 51a as an etching mask to expose an end surface of the through via structure 15, and while the mask pattern 51a remains, the redistributed interconnection adhesive film 54 is conformally formed on the top surface 1b of the substrate 1. A plate process is performed using the redistributed interconnection adhesive film 54 to form a redistributed interconnection film 56a, thereby filling a space of the recessed portion 50a of the second protection film 50.

Referring to FIG. 18, a planarization process is performed to remove part of the redistributed interconnection film 56a and part of the redistributed interconnection adhesive film 54 and thereby a redistributed interconnection adhesive film pattern 54a and a redistributed interconnection pattern 56 are formed on the recessed portion 50a of the second protection film 50. The planarization process may be a chemical mechanical polishing (CMP) process. The mask pattern 51a may be used as a stop film of the planarization process. Top surfaces of the redistributed interconnection adhesive film pattern 54a and the redistributed interconnection pattern 56 may be coplanar with a top surface of the mask pattern 51a.

Subsequently, as illustrated in FIG. 16, an auxiliary redistributed interconnection adhesive film pattern 60a, an auxiliary redistributed interconnection pattern 62, and a passivation film 58 may be formed on the mask pattern 51a to complete the semiconductor device 102 of FIG. 16.

Figure 19:
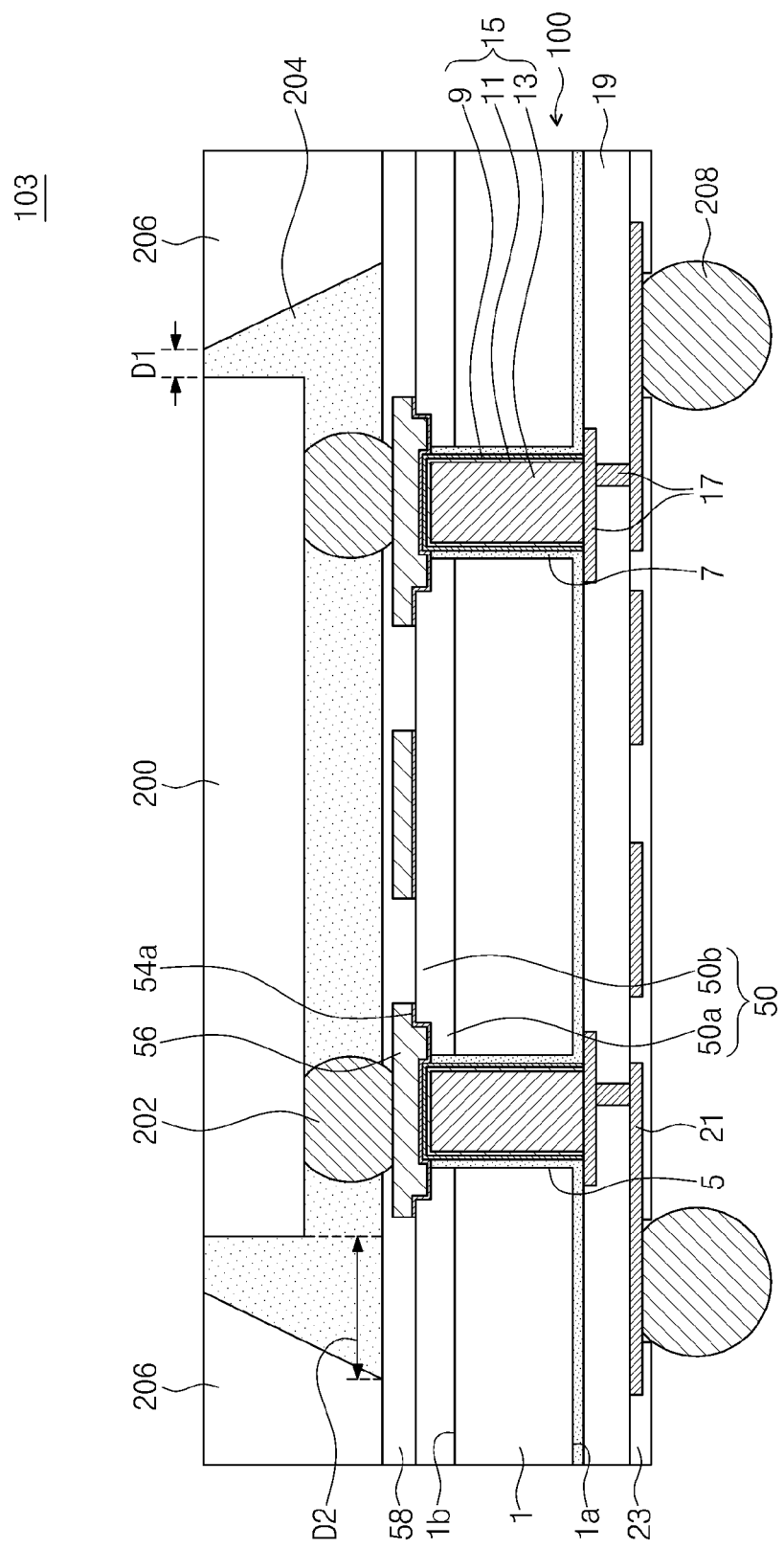
FIG. 19 is a cross sectional view of a semiconductor device in accordance with an embodiment of the inventive concept.

FIG. 19 is a cross sectional view of a semiconductor device in accordance with an embodiment of the inventive concept.

Referring to FIG. 19, a semiconductor device 103 in accordance with an embodiment has a semiconductor package structure in which a semiconductor chip 200 is mounted on the semiconductor device 100 described in connection with FIGS. 1 to 11. More specifically, the semiconductor chip 200 is mounted on the top surface 1b of the substrate 1. The semiconductor chip 200 is electrically connected to the semiconductor device 100 through the redistributed interconnection pattern 56 and a first conductive means 202. A second conductive means 208 may adhere to the pad 21 disposed on the bottom surface 1a of the substrate 1. The first conductive means 202 and the second conductive means 208 may include at least one selected from a group including, for example, a conductive bump, a conductive spacer, a solder ball, and a pin grid array. An underfill film 204 is interposed between the semiconductor chip 200 and the passivation film 58. The underfill film 204 may extend to cover a sidewall of the semiconductor chip 200 and part of a top surface of the adjacent passivation film 58. The underfill film 204 may also have an inclined side. The inclined side of the underfill film 204 and part of the top surface of the adjacent passivation film 58 are covered with a molding film 206. Top surfaces of the molding film 206, the underfill film 204, and the semiconductor chip 200 may be coplanar with one another. The underfill film 204 may have a thermal expansion coefficient greater than a thermal expansion coefficient of the semiconductor chip 200 and smaller than a thermal expansion coefficient of the molding film 206. Thus, an interface detachment phenomenon due to differences in thermal expansion coefficients between the semiconductor chip 200 and the molding film 206 may be reduced. Also, a contact area can be obtained while the molding film 206 contacts the underfill film 204. A thickness D1 of the underfill film 204 in a horizontal direction from a top end of the semiconductor chip 200 may be 5 μm, and as a consequence, a likelihood that detachment occurs among the semiconductor chip 200, the underfill film 204, and the molding film 206 can be minimized. Another thickness D2 of the underfill film 204 as illustrated in FIG. 19 may be 700 μm or less. As a consequence, a contact area between the molding film 206 and the passivation film 58 may be maximally obtained. A structure except those described above may be identical to or similar to the embodiment described in connection with FIG. 1. The molding film 206 may be processed in a wafer level.

Figure 20:
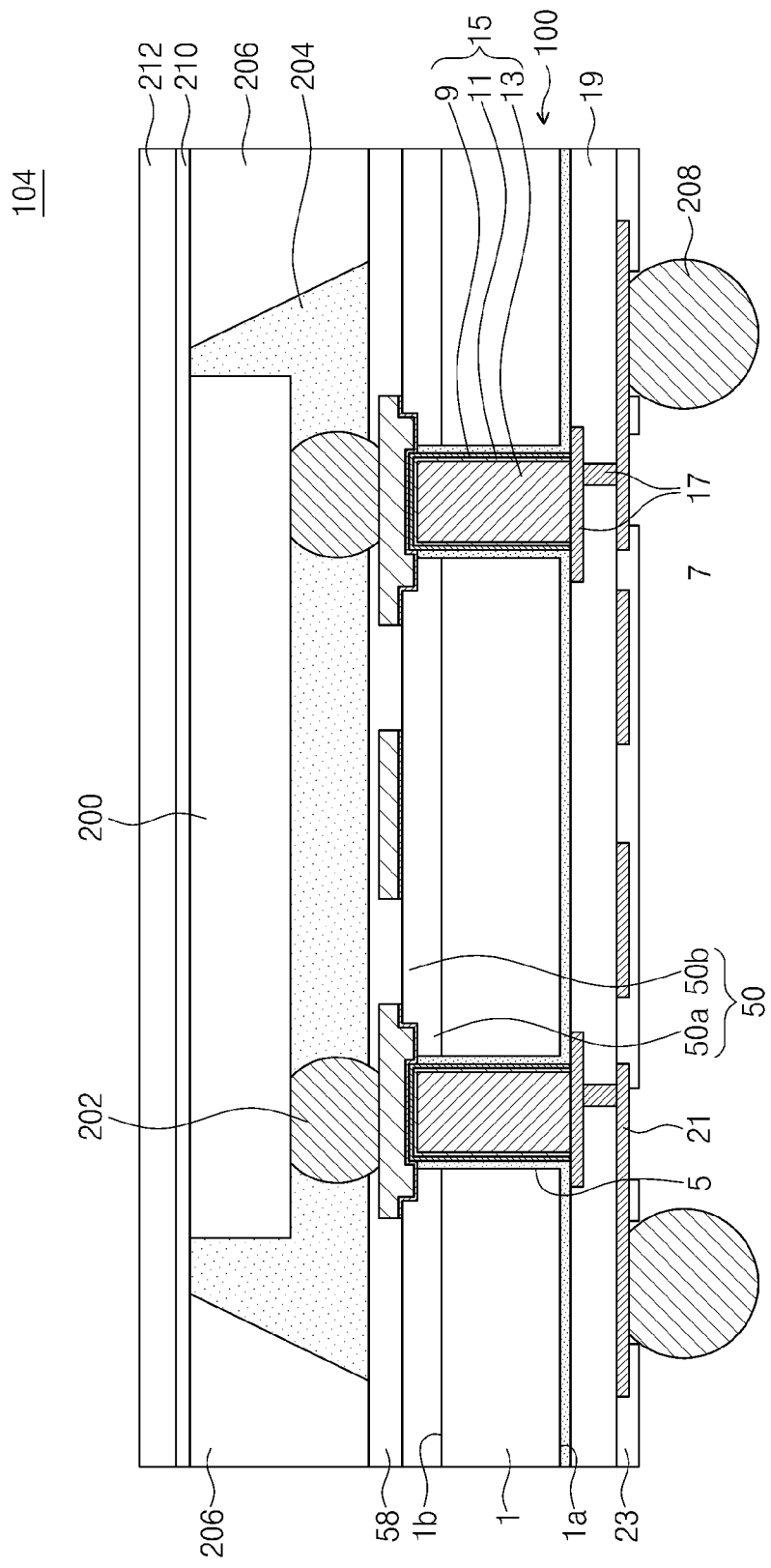
FIG. 20 is a cross sectional view of a semiconductor device in accordance with an embodiment of the inventive concept.

FIG. 20 is a cross sectional view of a semiconductor device in accordance with an embodiment of the inventive concept.

Referring to FIG. 20, a semiconductor device 104 in accordance with an embodiment has a semiconductor package structure in which a thermal interface material 210 and a heat sink 212 are disposed on the semiconductor device 103 illustrated in FIG. 19. More specifically, the thermal interface material 210 and the heat sink 212 are sequentially stacked on top surfaces of the semiconductor chip 200, the underfill film 204, and the molding film 206. A sclerotic adhesive including an epoxy resin and metal particles, such as silver, or metal oxide particles, such as alumina (Al2O3), in the epoxy resin and paste-type thermal grease including particles, such as diamond, aluminum nitride (AlN), alumina (Al2O3), zinc oxide (ZnO), silver (Ag), etc., may be used as the thermal interface material 210. The heat sink 212 is a material having a high thermal conductivity and may include, for example, a metal plate. A structure except those described above may be identical to or similar to the embodiment described in connection with FIG. 19.

Figure 21:
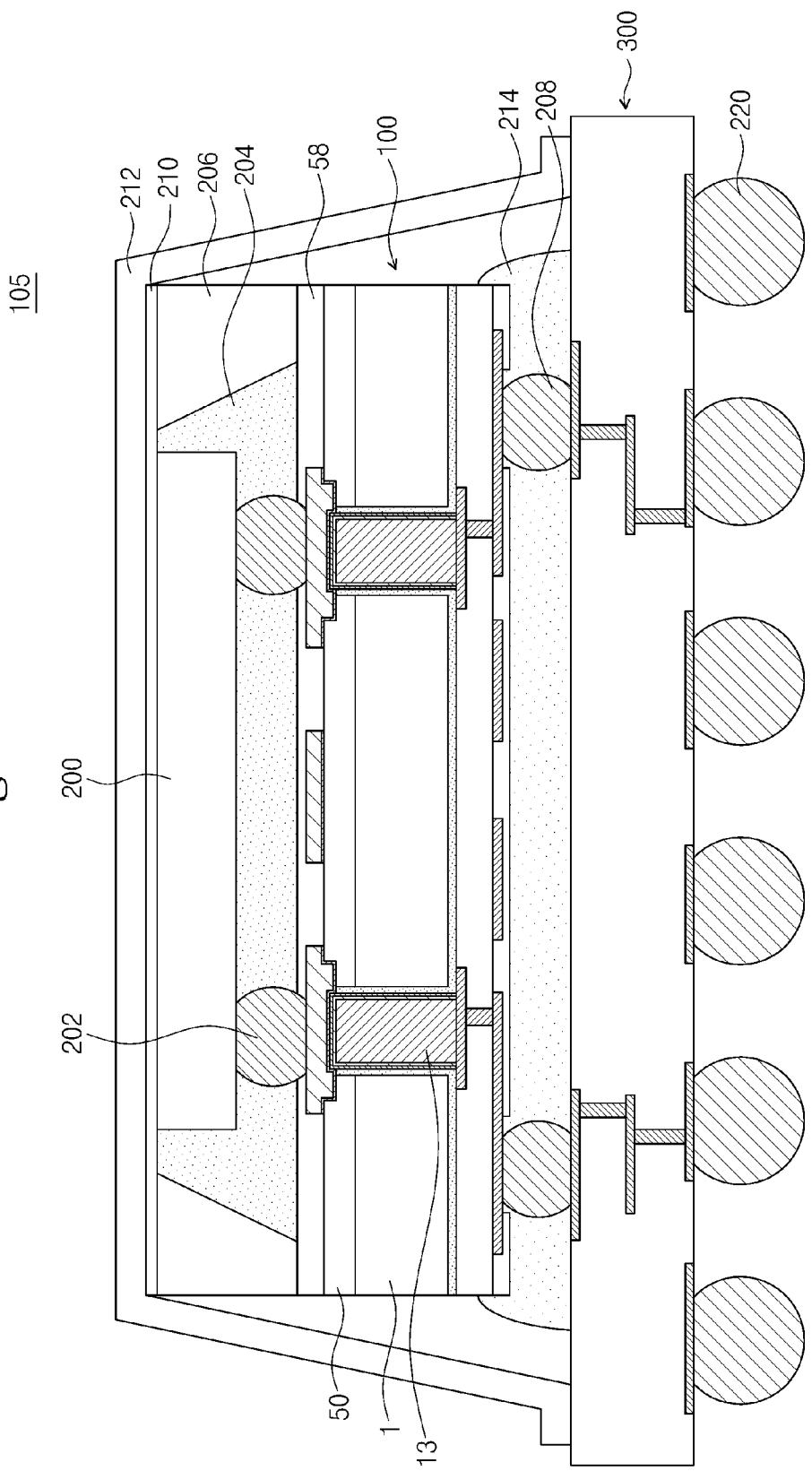
FIG. 21 is a cross sectional view of a semiconductor device in accordance with an embodiment of the inventive concept.

FIG. 21 is a cross sectional view of a semiconductor device in accordance with an embodiment of the inventive concept.

Referring to FIG. 21, a semiconductor device 105 in accordance with an embodiment has a semiconductor package structure in which the semiconductor device 104 illustrated in FIG. 20 is mounted on a package substrate 300. More specifically, a semiconductor device 100 as illustrated in FIG. 1 is mounted on the package substrate 300 via the second conductive means 208. The semiconductor chip 200 is mounted on the semiconductor device 100 via the first conductive means 202. An underfill resin 214 may fill a space between the semiconductor device 100 and the package substrate 300. According to an embodiment, the heat sink 212 may have a hat shape covering the semiconductor chip 200 and the semiconductor device 100, and a lower portion of the heat sink 212 may contact a top surface of the package substrate 300. According to an embodiment, the heat sink 212 may be electrically connected to a ground plate disposed in the package substrate 300. A third conductive means 220 may be connected to a bottom surface of the package substrate 300. A structure except those described above may be identical to or similar to the embodiment described in connection with FIG. 20.

Figure 22:
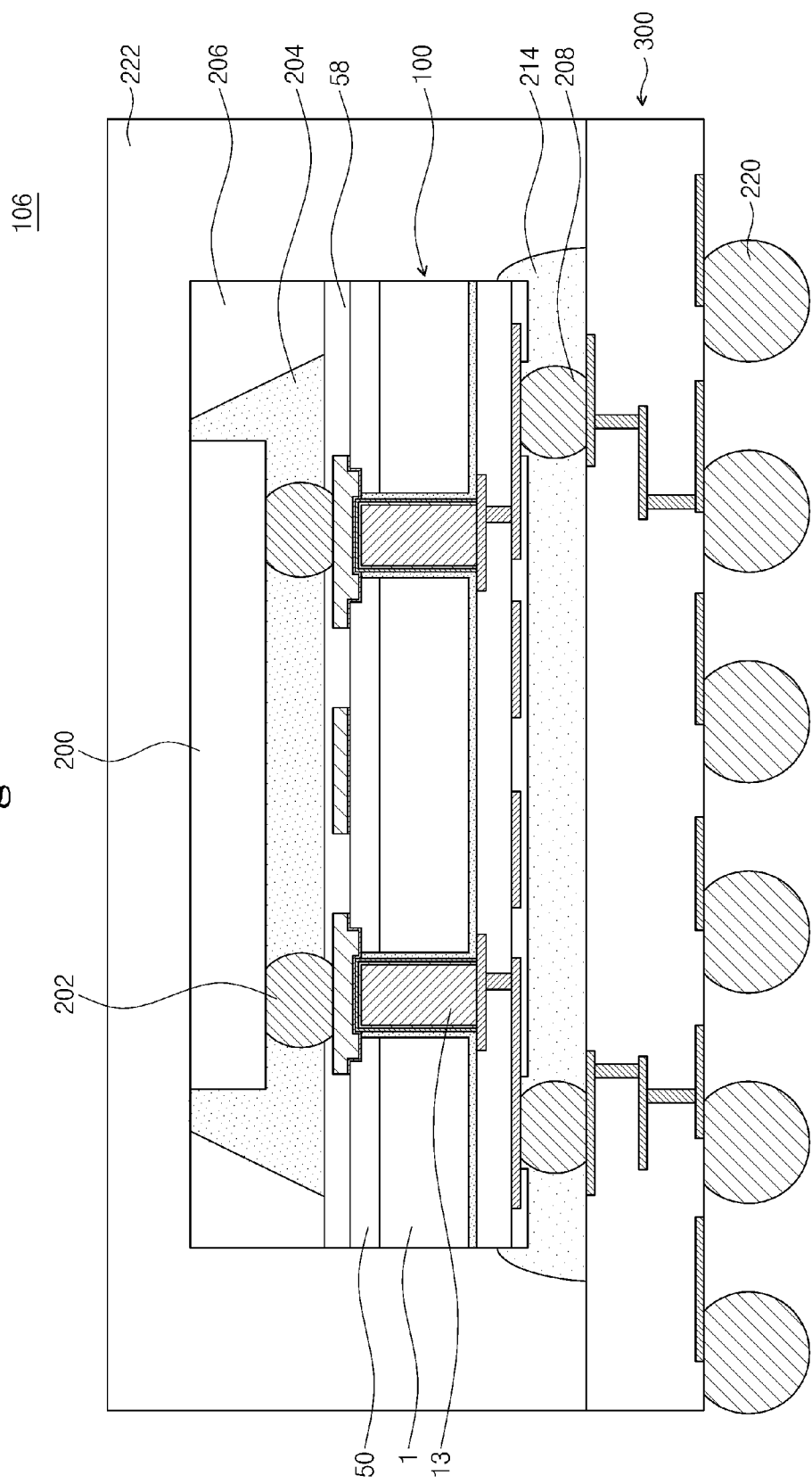
FIG. 22 is a cross sectional view of a semiconductor device in accordance with an embodiment of the inventive concept.

FIG. 22 is a cross sectional view of a semiconductor device in accordance with an embodiment of the inventive concept.

Referring to FIG. 22, a semiconductor device 106 in accordance with an embodiment has a semiconductor package structure in which a semiconductor device 105 as illustrated in FIG. 21 is covered with an over mold film 222 without the thermal interface material 210 and the heat sink 212. More specifically, a semiconductor device 100 as illustrated in FIG. 1 is mounted on the package substrate 300 via the second conductive means 208. The semiconductor chip 200 is mounted on the semiconductor device 100 via the first conductive means 202. A space between the semiconductor device 100 and the package substrate 300 may be filled with the underfill resin 214. Top surfaces of the semiconductor chip 200, the underfill film 204, the mold film 206, the package substrate 300, and sidewalls of the semiconductor device 100 are covered with the over mold film 222. A structure except those described above may be identical to or similar to the embodiment described in connection with FIG. 21.

Figure 23:
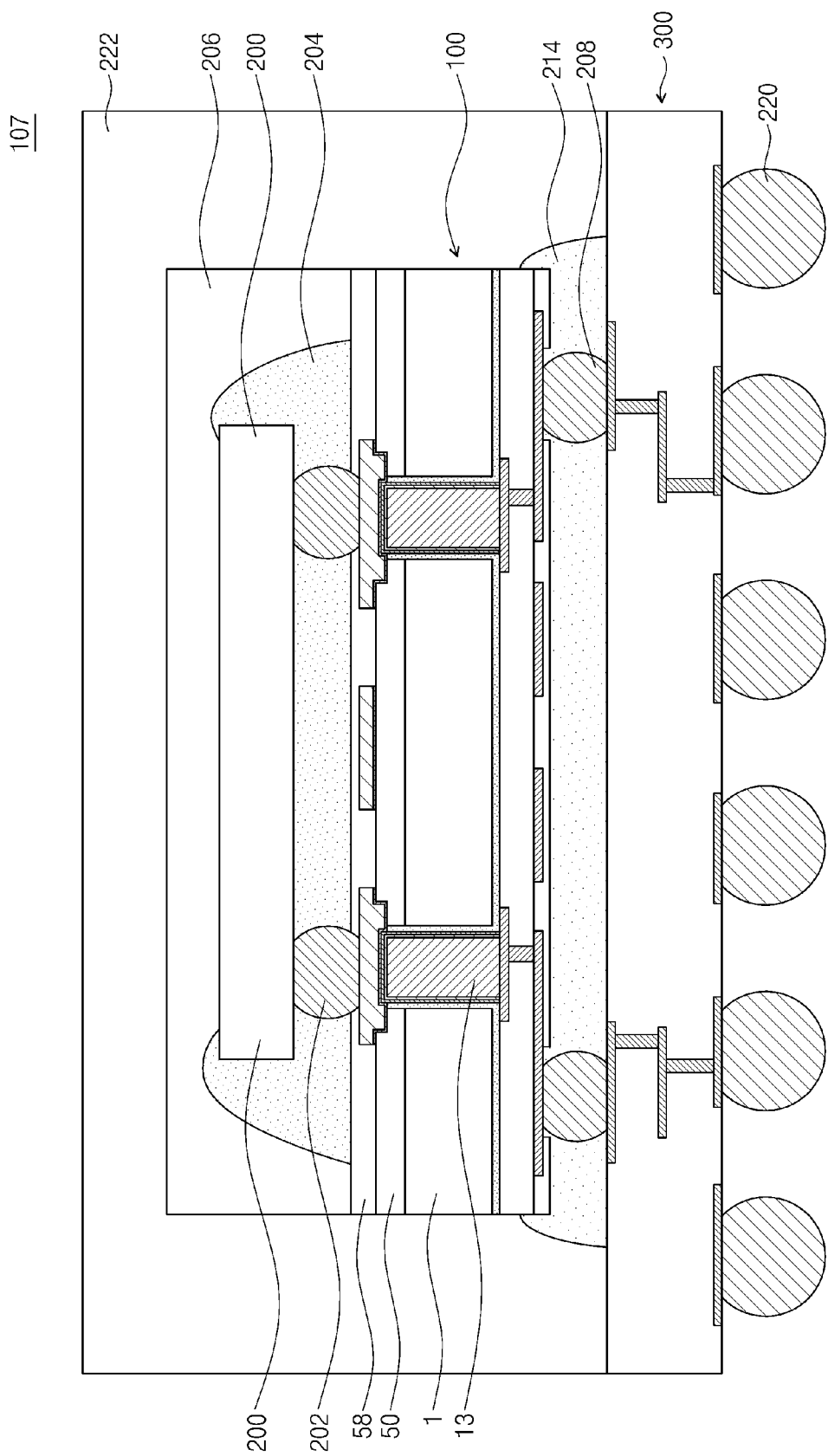
FIG. 23 is a cross sectional view of a semiconductor device in accordance with an embodiment of the inventive concept.

FIG. 23 is a cross sectional view of a semiconductor device in accordance with an embodiment of the inventive concept.

Referring to FIG. 23, a semiconductor device 107 in accordance with an embodiment is similar to the semiconductor device 106 of FIG. 22, but shapes of the mold film 206 and the underfill film 204 of the semiconductor device 107 are different from shapes of the mold film 206 and the underfill film 204 of the semiconductor device 106. More specifically, the underfill film 204 covers sidewalls of the semiconductor chip 200 and a part of a top surface of the semiconductor chip 200 adjacent to the sidewalls of the semiconductor chip 200. A top surface of the underfill film 204 protrudes higher than the top surface of the semiconductor chip 200. The mold film 206 covers the top surface of the semiconductor chip 200 and the underfill film 204. A structure except those described above may be identical to or similar to the embodiment described in connection with FIG. 22.

The aforementioned semiconductor device technology may be applied to various semiconductor devices and package modules including the semiconductor devices.

Figure 24:
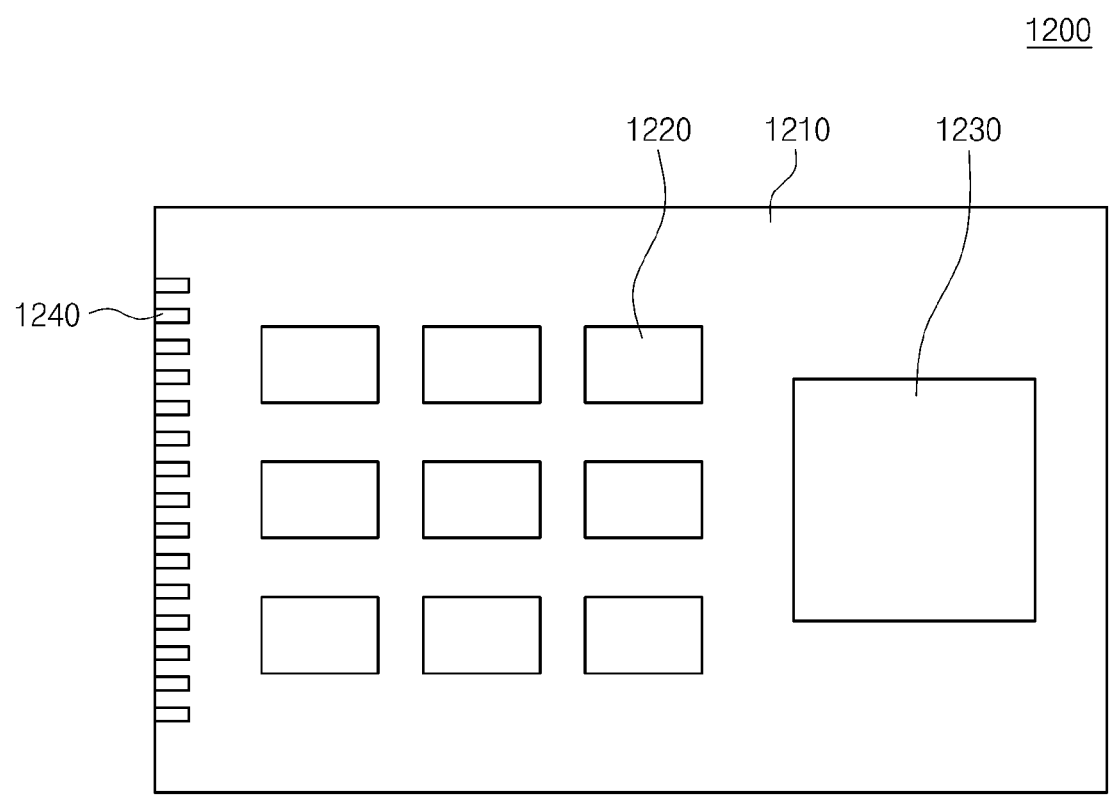
FIG. 24 is a view illustrating an example of a package module including a semiconductor device to which an embodiment of the inventive concept is applied.

FIG. 24 is a view illustrating an example of a package module including a semiconductor device according to an embodiment of the inventive concept. Referring to FIG. 24, a package module 1200 may include a semiconductor integrated circuit chip 1220 and a semiconductor integrated circuit chip 1230 packaged as a quad flat package (QFP). The package module 1200 may be formed by installing the semiconductor integrated circuit chips 1220 and 1230 to which a technology according to an embodiment of the inventive concept is applied on a substrate 1210. The package module 1200 may be connected to an external device through an external connection terminal 1240 provided at one side of the substrate 1210.

Figure 25:
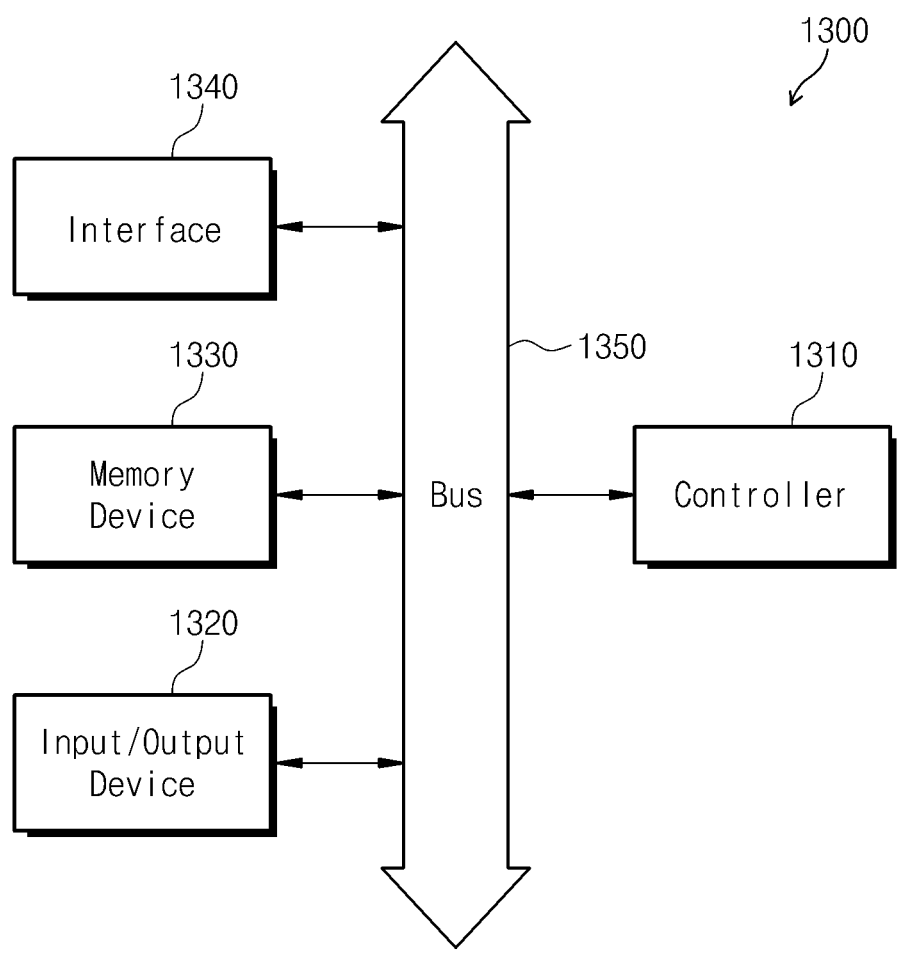
FIG. 25 is a block diagram illustrating an example of an electronic device including a semiconductor device to which an embodiment of the inventive concept is applied.

The semiconductor device technology described above may be applied to an electronic device. FIG. 25 is a block diagram illustrating an example of an electronic device including a semiconductor device according to an embodiment of the inventive concept.

Referring to FIG. 25, an electronic device 1300 may include a controller 1310, an input/output device 1320, and a memory device 1330. The controller 1310, the input/output device 1320, and the memory device 1330 may be connected to each other through a bus 1350. The bus 1350 may be a path through which data transfer. The controller 1310 may include at least one of a micro processor, a digital signal processor, a microcontroller, and a logic device having a function similar to the micro processor, the digital signal processor and the microcontroller. The controller 1310 and the memory device 1330 may include a semiconductor device in accordance with an embodiment of the inventive concept. The input/output device 1320 may include at least one selected from a keypad, a keyboard, and a display device. The memory device 1330 is a data storage device. The memory device 1330 may store data and/or a command executed by the controller 1310. The memory device 1330 may include a volatile memory device and/or a nonvolatile memory device. The memory device 1330 may be formed of a flash memory. For example, a flash memory to which a technique according to an embodiment of the present inventive concept is applied may be built in a data processing system, such as a mobile device or a desk top computer. The flash memory may be included in a semiconductor disc device (SSD). According to an embodiment, the electronic device 1300 can stably store huge amounts of data in the flash memory. The electronic device 1300 may further include an interface 1340 for transmitting data to a communication network or receiving data from a communication network. The interface 1340 may be a wire/wireless type of interface. The interface 1340 may include an antenna or a wire/wireless transceiver. According to an embodiment, the electronic device 1300 may further include an application chip set, a camera image processor (CIS), and an input/output device.

The electronic device 1300 may be embodied in a mobile system, a personnel computer, an industrial computer, or a logic system performing a variety of functions. For instance, the mobile system may be one of a personal digital assistant (PDA), a portable computer, a web tablet, a mobile phone, a wireless phone, a laptop computer, a memory card, a digital music system, and a data transmission/receipt system. In the case that the electronic system 1300 is equipment that can perform a wireless communication function, the electronic system 1300 may be used in a communication interface protocol, such as CDMA, GSM, NADC, E-TDMA, or CDMA2000.

In a semiconductor device in accordance with an embodiment of the inventive concept, since a redistributed interconnection pattern is disposed on a protection film of a convex-concave structure having a protrusion and a recessed portion, a contact area between the protection film and the redistributed interconnection becomes wide, thereby preventing detachment of the redistributed interconnection pattern. Also, in a semiconductor device in accordance with an embodiment of the inventive concept, since an angle between an end surface of insulating film liner and a side of through via structure is 90 degree or less, a leakage current from the through via structure may be prevented and occurrence of a notch between the through via structure and the insulating film liner may be prevented, thereby improving reliability of the semiconductor device. Also, a step coverage characteristic of a redistributed interconnection adhesive film for forming a redistributed interconnection pattern may be improved. Therefore, a semiconductor device having improved reliability while preventing a leakage current may be embodied.

In a method of manufacturing a semiconductor device in accordance with an embodiment, since an end surface of through via structure is exposed by removing a protection film and an insulating film liner using a selective etching process, damage to the through via structure is minimized, thereby preventing copper contamination in a substrate.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:
1. A semiconductor device comprising:
a substrate including a first surface and a second surface;
a protection film having a protrusion and a recessed portion, the protection film being disposed on the first surface;

a through via structure penetrating the substrate and the protection film and including an end surface coplanar with or higher than the recessed portion of the protection film;

a first interconnection pattern conformally covering a side surface and a lower surface of the recessed portion of the protection film, wherein a surface of the first interconnection pattern is coplanar with a surface of the protrusion;

a second interconnection pattern covering the first interconnection pattern and disposed in the recessed portion of the protection film, wherein a top surface of the first interconnection pattern is exposed by the second interconnection pattern; and a mask pattern having an etching selectivity with respect to the protection film, the mask pattern being interposed between the protection film and the second interconnection pattern.

2. The semiconductor device of claim 1, wherein the protrusion of the protection film is higher than the end surface of the through via structure.

3. The semiconductor device of claim 1, wherein the through via structure comprises:
   a through via plug;
   a through via seed film on a side surface of the through via plug; and
   a diffusion prevention film on a side surface of the through via seed film and at the end surface of the through via structure.

4. The semiconductor device of claim 1, further comprising an insulating film liner between the through via structure and the substrate and between the through via structure and the protection film, wherein an angle between a top surface of the insulating film liner and a side surface of the through via structure is 90 degree or less.

5. The semiconductor device of claim 1, wherein the insulating film liner and the protection film include a same material.

6. The semiconductor device of claim 1, wherein a width of the recessed portion is greater than a width of the through via structure.

7. The semiconductor device of claim 1, further comprising interconnections and an interlayer insulating film on the second surface.

8. A semiconductor device comprising:
   a substrate having a first surface and a second surface;
   a protection film on the first surface of the substrate, wherein the protection film includes at least one portion recessed toward the second surface of the substrate;
   a through via structure formed through the substrate and the recessed portion of the protection film in a direction perpendicular to the substrate and the protection film;
   a first interconnection pattern covering a side surface and a lower surface of the recessed portion of the protection film and an end surface of the through via structure, wherein an upper surface of the first interconnection pattern on the through via structure is disposed at a higher level than the upper surface of the first interconnection pattern on the lower surface of the recessed portion of the protection film; and
   a second interconnection pattern formed on the first interconnection pattern.

9. The semiconductor device of claim 8, wherein a top surface of the through via structure is coplanar with a top surface of the recessed portion of the protection film.

10. The semiconductor device of claim 8, wherein a top surface of the through via structure is higher than a top surface of the recessed portion of the protection film.

11. The semiconductor device of claim 8, wherein the through via structure comprises:
    a through via plug;
    a through via seed film covering the through via plug; and
    a diffusion prevention film covering the through via seed film.

12. The semiconductor device of claim 8, further comprising an insulating film liner between the through via structure and the substrate and between the through via structure and the protection film, wherein a top surface of the insulating film liner is coplanar with a top surface of the recessed portion of the protection film.

13. The semiconductor device of claim 8, further comprising an insulating film liner between the through via structure and the substrate and between the through via structure and the protection film, wherein a top surface of the insulating film liner is inclined toward a side surface of the through via structure.

14. The semiconductor device of claim 8, further comprising:
    a mask pattern on a top surface of the protection film except for the recessed portion;
    a first auxiliary interconnection pattern on the first and second interconnection patterns and part of the mask pattern; and
    a second auxiliary interconnection pattern on the first auxiliary interconnection pattern, wherein top surfaces of the first and second interconnection patterns are coplanar with a top surface of the part of the mask pattern.

15. A semiconductor device comprising:
    a substrate having a first surface and a second surface;
    a protection film on the first surface of the substrate, wherein the protection film includes at least one portion recessed toward the second surface of the substrate;
    a through via structure formed through the substrate and the recessed portion of the protection film in a direction perpendicular to the substrate and the protection film;
    a first interconnection pattern covering a side surface and a lower surface of the recessed portion of the protection film; and
    a second interconnection pattern covering the first interconnection pattern and disposed in the recessed portion of the protection film, wherein an upper surface of the second interconnection pattern is substantially coplanar with an uppermost surface of the first interconnection pattern.

* * * * *